United States Patent [19]
Yen

[11] Patent Number: 5,271,803
[45] Date of Patent: Dec. 21, 1993

[54] METHOD OF FORMING FINISHED EDGE OF PLURAL-LAYER OPTICAL MEMBRANE

[76] Inventor: Yung-Tsai Yen, 196 Tuscaloosa Ave., Atherton, Calif. 94025

[21] Appl. No.: 818,337

[22] Filed: Jan. 9, 1992

[51] Int. Cl.$^5$ .............................................. B29D 11/00
[52] U.S. Cl. .................................... 156/645; 156/652; 156/655; 156/668
[58] Field of Search ............... 156/645, 652, 655, 668, 156/661.1

[56] References Cited

U.S. PATENT DOCUMENTS

| | | | |
|---|---|---|---|
| 3,186,883 | 11/1962 | Frantzen | 156/644 |
| 3,614,822 | 10/1971 | Brown | 156/661.1 X |
| 4,240,869 | 12/1980 | Diepers | 156/652 X |
| 4,738,746 | 4/1988 | Clarion | 156/645 X |
| 4,818,336 | 4/1989 | Rosetti | 156/651 |
| 4,944,838 | 7/1990 | Koch et al. | 156/652 |

Primary Examiner—Thi Dang
Attorney, Agent, or Firm—Kolisch Hartwell Dickinson McCormack & Heuser

[57] ABSTRACT

A method of forming a finished edge on a plural-layer optical membrane is disclosed. The method involves dissolving a desired portion of an outer layer with a solvent that dissolves the outer layer but has no substantial effect on a first next layer, and repeating the dissolving for a corresponding portion of such first next layer with a solvent that dissolves the first next layer but has no substantial effect on the outer layer. The plural-layer membrane may include five layers with a pair of opposing outer layers of a fluoropolymer-based polymer, a pair of intermediate layers of polymers chosen from the group consisting of polyvinylnaphthalene, polymethylstyrene, or polystyrene, and a core layer of a nitrocellulose-based polymer. The solvents for dissolving each layer are freon for the outer layers, toluene or xylene for the intermediate layers, and acetone for the core layer.

7 Claims, 1 Drawing Sheet

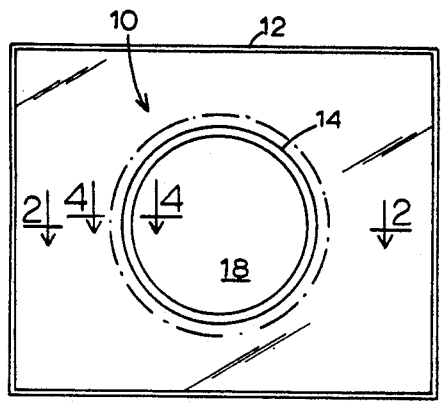
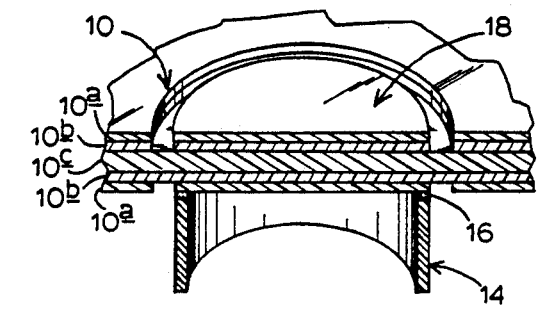
FIG.1    FIG.2
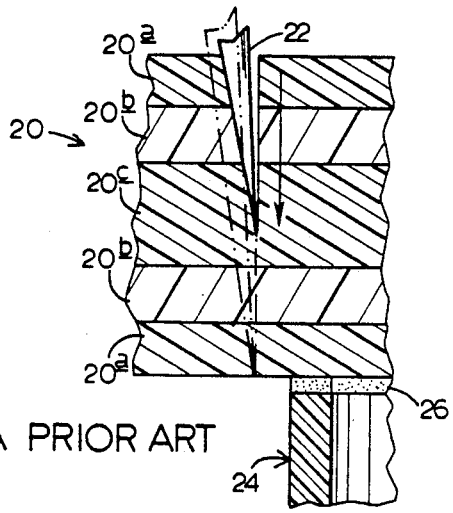
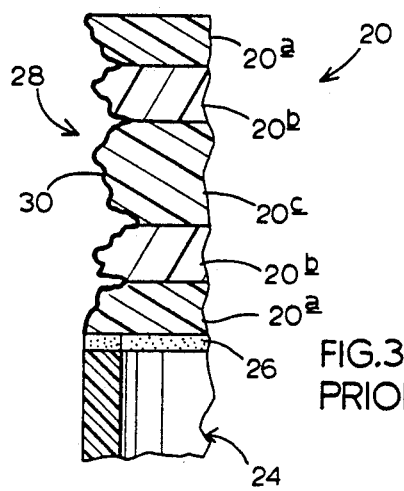
FIG.3A PRIOR ART    FIG.3B PRIOR ART
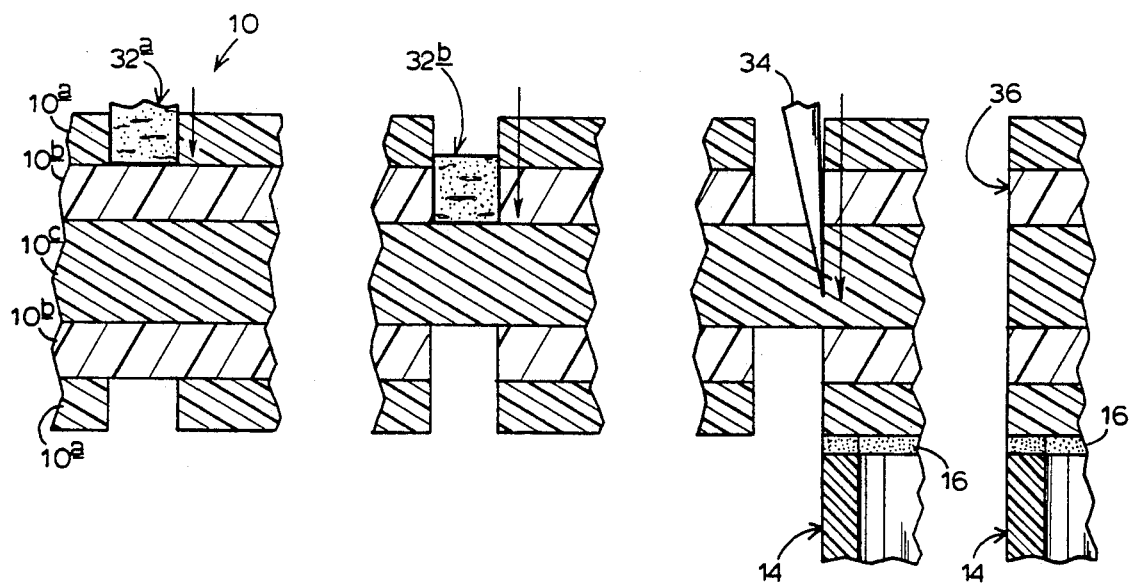
FIG.4A    FIG.4B    FIG.4C    FIG.4D

METHOD OF FORMING FINISHED EDGE OF PLURAL-LAYER OPTICAL MEMBRANE

BACKGROUND OF THE INVENTION

The present invention relates to plural-layer membranes generally, and to optical membranes or pellicles that are used in the semi-conductor chip industry. More particularly, the present invention relates to a method of forming a finished edge on plural-layer optical membranes that is used in connection with the manufacture of pellicles.

In the semi-conductor chip industry it is well known that pattern transfer from the photo mask to substrate is accomplished by directing light from a suitable light source through the mask to the substrate. During the pattern transfer process, also called the photolithographic process, the patterns on the photo mask are projected onto the substrate which has been treated with a photo-sensitive substance. This results in the mask pattern being reproduced on to the substrate.

A manufacturing problem is encountered when foreign substances are present on the surface of the mask. There is a problem because foreign substances on the mask surface will also be reproduced on the substrate and therefore will interfere with proper pattern transfer.

To eliminate contamination of the mask surface, a framed, thin membrane known as a pellicle is mounted on it. The pellicle membrane extends parallel to the mask, and at a predetermined distance spaced away from the mask. Any contamination which would ordinarily land on the mask surface, falls onto the pellicle membrane rather than onto the mask.

Pellicles eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or the pellicle frame. Such particles may drop onto the mask surface during photolithography which is precisely what is to be avoided by using pellicles.

It is also critical that the pellicle membrane be extremely uniform across its surface. Membrane uniformity ensures that light passing through the membrane during photolithography will not be obstructed or refracted in any way. The composition of the membrane must be highly uniform, and the membrane must be tensioned evenly across the pellicle frame. Also, it is important to ensure that a continuous seal exists between the relatively thin membrane and the frame.

To further understand these important requirements, it is necessary to provide an explanation of how pellicles are formed. For purposes of the present invention, conventional plural-layer pellicle fabrication will be discussed.

As is known in the art, forming a plural layer optical membrane is the first step in plural-layer pellicle manufacture. Commonly a first, or core, layer is formed by spinning a suitable polymer, such as nitrocellulose-based one, on a substrate. Next, additional so-called antireflective (AR-) coating layers are formed on opposing sides of the core layer using conventional processes such as spinning. Commonly, a five-layer optical membrane is formed with a core layer, single opposing intermediate AR-coating layers, and single opposing outer AR-coating layers.

After the plural layer membrane is formed it is held under tension adjacent its periphery by an outer frame to prepare it for subsequent manufacturing steps.

Next, a frame is fastened or bonded to a working area of the membrane, framing the working area. After fastening, the framed working area is ready to be separated from the remaining area of the membrane.

It is this separating step that is of the utmost importance to high quality pellicle manufacture. For it is during the separating step that the framed working area must be cut away from the remainder of the membrane. Using the assembly and method of the present invention, a surprisingly successful separation is obtained.

Currently, it is known to remove the framed working area by following a two-step procedure. First, the membrane is cut outward of the frame using a suitable knife, or razor blade. Second, after cutting, a multi-component solvent formulation and/or heat is used in a conventional process to form a finished peripheral edge of the membrane.

There are contamination problems associated with the first step (i.e. cutting) and these are overcome/reduced by using a novel wet die cutter assembly and method as disclosed in U.S. patent application, Ser. No. 07/763,422, entitled "Wet Die Cutter Assembly and Method", which application is incorporated herein by reference. Essentially, the contamination problems associated with conventional knife cutting are caused by "shattering" of the membrane in the non-working area which produces contaminant particles that may collect on the frame or working area. Additional problems are caused by the membrane tearing in undesired directions and for undesired lengths causing damage to the integrity of the working area.

There are also contamination problems associated with the second step (i.e. finishing) and these are the problems that the present invention is designed to reduce/overcome. When practicing a conventional finishing step, the use of a multi-component solvent blend (or acetone) results in a contaminant film forming on the peripheral edge of the membrane. The film is left after residual solvent evaporates. The film is comprised of a combination of small to microscopic particles from each of the layers because the solvent blend is formulated to dissolve all the layers, resulting in a heterogenous mixture of solvent and polymers from each layer.

Also, the solvent seeps into and eats away at the interface between layers causing surface irregularities and resulting in further deposit of the above-identified contaminated film.

The contaminated film dries and becomes powdery over time. After pellicles are manufactured using conventional methods they are shipped in separate bags or containers. During shipping, adjacent pellicles will rub against each other which scatters the contaminant powder on the edges of the pellicles with some of it falling on the pellicle surface. Using such powdery pellicles in subsequent photolithography operations will contaminate the operation and defeat the protective purpose for using the pellicle in the first place. The presence of the film on the pellicle also makes it susceptible to microscopic shattering when handled by technicians.

Another problem is that there is unpredictability associated with the conventional finishing step. That is, pellicles formed with this step may have varying amounts of the contaminated film because the amount of such film formed from multiple-layer dissolving by the solvent will vary.

Accordingly, it is a general object of the present invention to provide a unique method for making a predictably finished edge of an optical membrane with a reduced amount of contaminant on it.

Another object of the invention is to provide a unique method for promoting contaminant-free finishing of a separated edge of a framed working area of a membrane.

SUMMARY OF THE INVENTION

The present invention embodies a method of making a finished edge on a plural-layer optical membrane with adjacent layers being soluble in different solvents. The method includes dissolving a desired portion of an outer layer with a solvent that dissolves the outer layer but has no substantial effect on a first next layer, and repeating the dissolving for a corresponding portion of such first next layer with a solvent that dissolves the first next layer but has no substantial effect on the outer layer.

The repeating step involves a solvent that also has no substantial effect on a second next layer, and the method further includes the step of reiterating the dissolving step for a corresponding portion of such second next layer with a solvent that dissolves it but has no substantial effect on the first next layer.

The dissolving step may involve desired portions of a pair of outer layers, and the repeating step may involve desired portions of a pair of first next layers.

The various objects and advantages which are attained by the invention will become more fully apparent as the description which now follows is read in conjunction with the drawings.

DESCRIPTION OF THE DRAWINGS

FIG. 1 is a top view of a plural-layer optical membrane showing a framed working area in a central region of it.

FIG. 2 is an enlarged, fragmentary, side sectional perspective view taken along line 2—2 of FIG. 1.

FIG. 3A is an enlarged, fragmentary side-sectional view of a framed working area of a plural-layer membrane similar to that shown in FIG. 2, and showing a conventional cutting step for separating the framed working area from the remainder of the membrane.

FIG. 3B is like FIG. 3A except that it shows an enlarged, exaggerated view of the edge of a pellicle after a conventional finishing step has been performed.

FIGS. 4A–4D are enlarged, fragmentary side-sectional views of the framed working area through line 4—4 of FIG. 1, showing the steps of the present invention.

DETAILED DESCRIPTION OF THE INVENTION

Turning now to the drawings, FIGS. 1 and 2 show a transparent, five-layer optical membrane 10 which may be formed by any conventional method, such as by spinning desired polymer formulations on a substrate (undepicted) to form outer layers and a core layer. Referring to FIG. 2, as is common membrane 10 is formed with opposing fluoropolymer-based outer layer 10a, opposing polyvinylnaphthalene-based intermediate layers 10b, and a nitrocellulose-based core layer 10c.

Membrane 10 is meant to be representative of known plural-layer membranes and those skilled in the art know that many variations are possible. For example, polymethylstyrene or polystyrene may be used instead of polyvinylnaphthalene.

Membrane 10 is attached to and tensed by a peripheral frame 12. Attachment of the membrane and peripheral frame may be accomplished by any of the usual methods such as by adhesion or friction. A support frame 14 has been fastened to the underside of membrane 10 by gluing to form a continuous bond. A portion of such bond is shown at 16 in FIGS. 2 and 4C–4D between support frame 14 and membrane 10. A working area 18 of membrane 10 is defined by support frame 14. The remainder of membrane 10, i.e. that portion that is outward of support frame 14, is separated and discarded as soon to be described.

Before describing the steps of the present invention, reference is made to FIGS. 3A–3B which depict prior art methods of cutting and finishing the edge of a membrane 20 having a pair of outer layers 20a, a pair of intermediate layers 20b and a core layer 20c. FIG. 3A shows that a blade 22 is moved through the membrane to cut it near but outward of the outer border of a support frame 24 that has been attached by adhesive 26 to membrane 20.

After cutting, a conventional finishing step (undepicted) is performed which involves applying a conventional multi-component solvent to the just cut edge to dissolve the membrane up to the outer border of support frame 24 as shown in FIG. 3B. Application of such solvent formulation may be done using known solvent applicators such as conventional sponge-tipped swabs.

As should be apparent from FIG. 3B, the conventional finishing step produces an edge 28 on membrane 20 that has all of the above-described contamination problems. The solvent causes a contaminated film 30 to form on edge 28 because the solvent has been formulated to dissolve all of layers 20a, 20b and 20c. The film results from a blend of the dissolved layers produced by the conventional solvent. After applying the solvent to the just cut edge (FIG. 3A) of membrane 20, residual solvent left on edge 28 evaporates, leaving behind film 30.

Over time the film dries and becomes powdery making shipping and handling of the pellicle likely to dislodge the powder which will fall on undesired areas such as the substrate. The solvent will also seep into and eat away at the interface between layers, also depositing the film there.

PREFERRED MODE OF PRACTICING INVENTION

Referring now to FIGS. 4A-4D, the preferred mode of practicing the present invention is shown. Before describing details, the reader should recognize that the steps shown in FIGS. 4A-4B are performed before support frame 14 is adherred to membrane 10, and the steps shown in FIGS. 4C-4D are performed after support frame 14 is adherred to membrane 10.

FIG. 4A shows a portion of a wet die cutter assembly 32a, disclosed in the above-identified copending patent application, being used to dissolve, or remove, one of the pair of outer layers 10a. The solvent retained in assembly 32a is freon for dissolving layers 10a. Freon has no substantial effect on layers 10b. A corresponding portion of the other layer 10a has already been removed using assembly 32a.

Other known solvent applicators may be used instead of wet die cutter assemblies to remove desired portions of layers 10a and 10b, and layer 10c. The preferred mode of practicing the present invention is to use different wet die cutter assemblies for each layer with each such assembly retaining a solvent suitable for dissolving each corresponding target layer.

Referring to FIG. 4B, one of intermediate layers 10b is being removed using assembly 32a that retains toluene or xylene for dissolving layers 10b. The pair of layers 10b may be thought of as first next layers. These solvents have no substantial effect on layers 10a or layer 10c. Similar to FIG. 4A, a corresponding portion of the other layer 10b has already been removed using assembly 32b.

Referring to FIGS. 4C-D, a blade 34 is moved through core layer 10c and then acetone is applied to the unfinished, just cut edge by using a conventional applicator like a sponge-tipped swab (undepicted) or another wet die cutter assembly (undepicted) that retains acetone. The result is a finished edge 36 that is superior to those obtained using conventional finishing processes. Core layer 10c may be thought of as a second next layer. Acetone has no substantial effect on layers 10a or layers 10b.

The method of the present invention may also be though of as a method of separating a framed working area from the remainder of a plural-layer membrane with adjacent layers being soluble in different solvents.

Alternatively, the invention may be thought of as providing for finished edge 36 of plural-layer optical membrane 10, with each of layers 10a-c being soluble in a solvent, by cutting through membrane 10 to produce an unfinished edge. In other words, blade 34 could be used to move through all layers of membrane 10 outward of the outer border of support frame 14 (similar to that shown in FIG. 3A). Additionally, the invention includes sequentially removing desired portions of each layer with preselected solvents, as shown and discussed in connection with FIGS. 4A-4D. Each preselected solvent dissolves the desired portion of one type of layer but not adjacent layers, such as freon which dissolves layers 10a but not layers 10b or layer 10c. The result of such sequential removing is to form an aligned finished edge 36.

The result of following the steps of the present invention is that a surprisingly, predictably finished edge of an optical membrane is formed with a reduced amount of contaminant on it. While it appears possible that an associated solvent for a layer may seep along the interface between the layer and an adjacent layer, such seeping does not appear to occur appreciably. Also, because each layer is sequentially removed with an appropriate solvent, a reduced amount, if any, of contaminant film is left after residual solvent evaporates along the edge.

Accordingly, while the preferred mode of practicing the present invention has been described, other variations and modifications are possible and may be made without departing from the spirit of the invention.

It is claimed and desired to secure by Letters Patent:

1. A method of making a finished, substantially contamination-free edge on a plural-plastic-layer optical membrane with adjacent layers being soluble in different solvents, comprising:
   dissolving a desired cross section of an outer layer with a solvent that dissolves the cross section but has no substantial effect on a first next layer;
   repeating the dissolving for a cross section of such first next layer which cross section is exposed by the previous dissolving step, with the repeating step involving a solvent that dissolves the cross section of the first next layer but has no substantial effect on the outer layer; and
   continuing the dissolving and repeating steps to dissolve all desired cross sections of additional layers, thereby to make a substantially contamination-free finished edge.

2. The method of claim 1 wherein the optical membrane has opposing outer layers, and the dissolving step is practiced on desired cross sections of the opposing outer layers.

3. The method of claim 2 wherein the optical membrane has opposing first next layers, and the repeating step is practiced on desired cross sections of the first next layers.

4. A method of separating a substantially contamination-free framed working area from the remainder of a plural-plastic-layer optical membrane with adjacent layers being soluble in different solvents, comprising:
   dissolving a desired cross section of an outer layer with a solvent that dissolves the cross section but has no substantial effect on a first next layer; and
   repeating the dissolving for a corresponding cross section of such first next layer, which cross section is exposed by the previous dissolving step, and with the repeating step involving a solvent that dissolves the first next layer but has no substantial effect on either the outer layer or a second next layer; and
   continuing the repeating for corresponding exposed cross sections of one or more additional next layers with solvents that dissolve the desired cross section but have no substantial effect on layers adjacent thereto, thereby ultimately to separate a substantially contamination-free framed working area from the remainder of the membrane.

5. The method of claim 4 wherein the optical membrane has five layers including opposing outer layers and opposing first next layers, and a single, additional core layer, and wherein the dissolving step involves desired cross sections of the opposing outer layers, the repeating step involves desired cross sections of the opposing first next layers, and the continuing step involves a desired cross section of the core layer.

6. A method of forming a substantially contamination-free finished edge of a plural-plastic-layer optical membrane with each layer being soluble in a solvent, comprising:

cutting through such a membrane to produce an unfinished edge; and sequentially removing desired cross sections of each layer adjacent the unfinished edge with preselected solvents that dissolve the desired cross section of one layer but have no substantial effect on adjacent layers, thereby to form an aligned substantially contamination-free finished edge.

7. The method of claim 6 wherein the step of sequentially removing includes the steps of first dissolving desired cross sections of opposing outer layers of a fluoropolymer-based polymer, second dissolving desired cross sections of opposing intermediate layers of polymer chosen from the group consisting of polyvinylnaphthalene, polymethylstyrene, or polystyrene, and third dissolving a desired cross section of a core layer of a nitrocellulose-based polymer.

* * * * *